United States Patent
Inagaki et al.

(10) Patent No.: US 7,245,493 B2
(45) Date of Patent: Jul. 17, 2007

(54) COOLER FOR COOLING ELECTRIC PART

(75) Inventors: Mitsuharu Inagaki, Kariya (JP); Junji Kato, Kariya (JP); Masahiro Shimoya, Kariya (JP); Jiro Ebihara, Nukata-gun (JP); Shinya Noro, Kariya (JP); Tomoaki Nakano, Obu (JP)

(73) Assignee: Denso Corporation, Kariya (JP)

( * ) Notice: Subject to any disclaimer, the term of this patent is extended or adjusted under 35 U.S.C. 154(b) by 299 days.

(21) Appl. No.: 10/902,803

(22) Filed: Aug. 2, 2004

(65) Prior Publication Data

US 2005/0030717 A1 Feb. 10, 2005

(30) Foreign Application Priority Data

Aug. 6, 2003 (JP) ............................. 2003-287397
Aug. 19, 2003 (JP) ............................. 2003-295412

(51) Int. Cl.
*G06F 1/20* (2006.01)
(52) U.S. Cl. ...................................... 361/699; 174/15.1
(58) Field of Classification Search ................ 361/699, 361/689, 698, 690; 174/15.1
See application file for complete search history.

(56) References Cited

U.S. PATENT DOCUMENTS

| 4,392,153 | A | * | 7/1983 | Glascock et al. ............ 257/746 |
| 4,631,636 | A | * | 12/1986 | Andrews ..................... 361/699 |
| 6,542,365 | B2 | * | 4/2003 | Inoue ........................ 361/699 |
| 7,106,592 | B2 | * | 9/2006 | Inoue et al. ................. 361/704 |

FOREIGN PATENT DOCUMENTS

| JP | A 61-279158 | 12/1986 |
| JP | A 63-96946 | 4/1988 |
| JP | A 6-291223 | 10/1994 |

* cited by examiner

*Primary Examiner*—Lisa Lea-Edmonds
(74) *Attorney, Agent, or Firm*—Oliff & Berridge, PLC

(57) ABSTRACT

A cooler cools a plurality of electric parts from both sides thereof. The cooler includes a plurality of cooling units including a pair of cooling tubes for flowing coolant therethrough. A pair of cooling tubes having a flat shape is disposed to sandwich the electric part so that both sides of the electric part are cooled by a pair of cooling tubes. The cooling units are disposed to align in a stacking direction. A clearance is disposed between the neighboring cooling units in the stacking direction.

17 Claims, 11 Drawing Sheets

COOLER FOR COOLING ELECTRIC PART

CROSS REFERENCE TO RELATED APPLICATIONS

This application is based on Japanese Patent Applications No. 2003-287397 filed on Aug. 6, 2003, and No. 2003-295412 filed on Aug. 19, 2003, the disclosures of which are incorporated herein by reference.

FIELD OF THE INVENTION

The present invention relates to a cooler for cooling electric equipment.

BACKGROUND OF THE INVENTION

A cooler for cooling electric equipment is disclosed in Japanese Patent Application Publication No. 2001-320005 and Japanese Patent Application Publication No. 2002-26215, both of which correspond to U.S. Pat. No. 6,542,365. As shown in FIG. 18, the cooler 9 includes a cooling tube 93. A pair of cooling tubes 93 sandwiches a semiconductor module 92 so that the semiconductor module 92 having a semiconductor chip discharges heat through the cooling tube 93. The semiconductor module 92 and a pair of cooling tubes 93 are fixed with a pair of pinching members 941, 942. Thus, a cooling unit 95 is composed of the semiconductor module 92, a pair of the cooling tube 93, and a pair of pinching members 941, 942. Both sides of the semiconductor module 92 are cooled by a pair of cooling tubes 93.

However, a distance 91 between two neighboring cooling units 95, i.e., the distance 91 between one pair of cooling tubes 93 and another pair of cooling tubes 93 is required to be a predetermined distance, which is equal to or larger than thickness of a pair of pinching members 941, 942. Specifically, the distance 91 is required to be larger than 10 mm. Therefore, dimensions of the cooler 9 become larger. Further, a pair of pinching members 941, 942 is necessitates for every cooling unit 95. Therefore, the number of parts of the cooler 9 becomes larger, and the number of man-hour for assembling the cooler 9 also becomes larger. Thus, a manufacturing cost of the cooler 9 becomes larger.

Further, to minimize the dimensions of the cooler 9, the cooling tube 93 and the semiconductor module 92 are alternately stacked. However, this construction may decrease a cooling performance of the cooler 9. This is because two semiconductor modules 92 are disposed on both sides of the cooling tube 95 so that heat generated in one of the module 92 may transfer to the other module 92 in a case where the heat generated in the one module 92 becomes much larger than that in the other module 92. Further, when the heat generated in each module 92 is different from each other so that thermal expansion of each cooling unit 95 is different. Therefore, load, i.e., stress may be applied partially. Furthermore, when the thickness of each module 92 is different, the variation in a stacking direction may generate the partial stress.

Furthermore, multiple modules 92 are stacked in parallel so that the cooling tubes 95 and the modules 92 are laminated in the stacking direction to form the multi-layered cooler 9. In this case, when the thickness of each module 92 is different from each other, the variation in the stacking direction becomes a problem. Specifically, the total variation of the thickness of cooler 9 becomes larger as the number of the modules 92 becomes larger. Therefore, pinching force of each pair of the pinching members 941, 942 may be different. Thus, heat resistance of contact between the cooling tube 95 and the module 92 becomes larger so that the cooling performance of the cooler 9 is reduced.

Here, the above semiconductor module including power device such as IGBT with a power converter circuit generates large heat. For example, the power converter circuit is suitably used for generating a driving current of an alternating-current motor in an automotive vehicle such as electric driving vehicle and a hybrid vehicle. In this case, the power converter circuit such as DC-DC converter circuit and an inverter circuit energizes the alternating-current motor as a driving power source of the electric vehicle or the hybrid vehicle.

In the cooler disclosed in Japanese Patent Application Publication No. 2002-26215, the semiconductor module is press-contacted to the cooling tube so that a contact area between the cooling tube and the module is increased. However, it is required to add new part for press-contacting the module to the cooling unit. Therefore, the construction of the cooler becomes complicated, and the dimensions of the cooler become larger. Furthermore, the cooler may be deformed in a loading direction so that the dimension accuracy of the cooler is reduced.

SUMMARY OF THE INVENTION

In view of the above-described problem, it is an object of the present invention to provide a cooler having high cooling performance and having minimum dimensions.

It is another object of the present invention to provide a cooler having high cooling performance and having high dimension accuracy.

A cooler cools a plurality of electric parts from both sides thereof. The cooler includes a plurality of cooling units including a pair of cooling tubes for flowing coolant therethrough. A pair of cooling tubes having a flat shape is disposed to sandwich the electric part so that both sides of the electric part are cooled by a pair of cooling tubes. The cooling units are disposed to align in a stacking direction. A clearance is disposed between the neighboring cooling units in the stacking direction.

In the above cooler, even when a heat generated in one electric part is different from another heat generated in another electric part, the heat is prevented from transferring from the one electric part to the other electric part. Thus, the cooling performance of the cooler is improved. The cooler includes no pinching member for pinching the cooling unit on both sides thereof. Therefore, the clearance between the cooling units can be narrowed so that the dimensions of the cooler are minimized. Thus, the cooler has high cooling performance and minimum dimensions.

Preferably, a pair of cooling tubes sandwiches two electric parts, which are disposed in parallel with the cooling tubes.

Preferably, the head has a longitudinal direction, which is parallel to the stacking direction of the cooling units, and perpendicular to a longitudinal direction of the cooling tubes.

Further, a cooler cools an electric part from both sides thereof. The cooler includes a cooling unit including a pair of cooling tubes for flowing coolant therethrough and a semiconductor module including the electric part. Each cooling tube has a flat shape, and includes a hollow portion for passing the coolant therethrough. A pair of cooling tubes faces each other. The semiconductor module is disposed between a pair of cooling tubes. The semiconductor module with a pair of cooling tubes is molded with a resin mold.

In the above cooler, the module effectively and stably contacts the cooling tube without applying any load between the cooling tube and the module. Further, no load is applied between the cooling tube and the module, so that the module with the cooling tube is not deformed substantially in a stacking direction by the load. Thus, the cooler has high accuracy of form. Further, heat generated in the module is effectively transferred to the cooling tube so that the cooler has high cooling performance.

Preferably, the cooling tube electrically connects to the electrode plate. The cooling tube is electrically insulated from the coolant, and one cooling tube is electrically insulated from the other cooling tube.

Preferably, the cooler further includes a concavity, which has a bottom of the cooling tube and an opening for opening to an outside from the resin mold.

Preferably, the cooler further includes a plurality of cooling units disposed to align in a stacking direction. A clearance is disposed between the neighboring cooling units in the stacking direction. More preferably, the clearance has a width in the stacking direction of the cooling units. The width of the clearance is smaller than a thickness of the electric part in the stacking direction.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
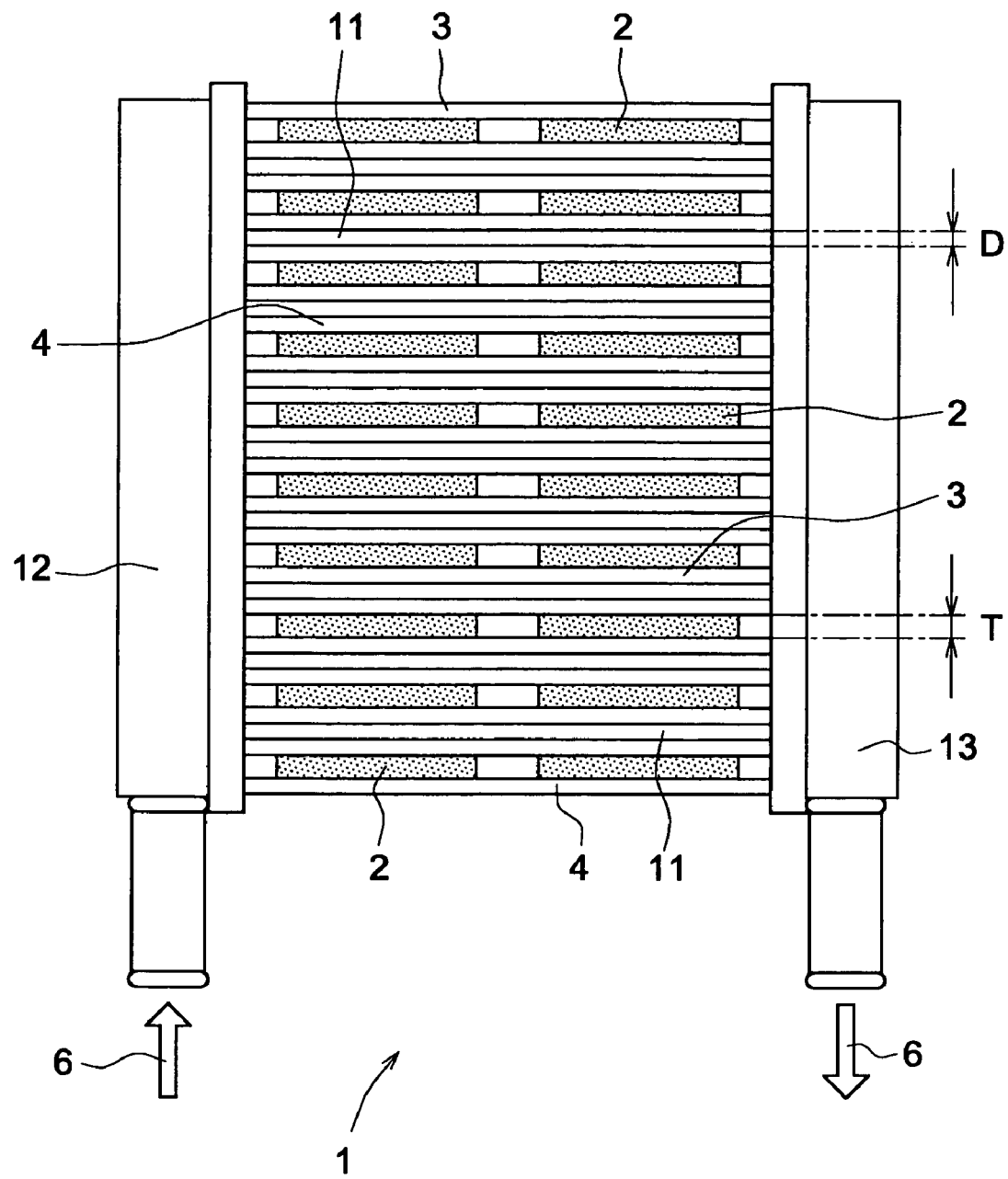
FIG. 1 is a plan view showing a cooler according to a first embodiment of the present invention.

A cooler 1 according to a first embodiment of the present invention is shown in FIG. 1. The cooler 1 cools multiple electric parts 2 on both sides thereof. The cooler 1 includes a cooling unit 4 having a pair of cooling tubes 3 for passing coolant 6 therethrough. The cooling tube 3 has a flat shape. A pair of the cooling tube 3 sandwiches two electric parts 2 disposed in parallel. Multiple cooling units 4 are stacked in a stacking direction, which is parallel to a thickness direction of the cooling tube 3. A clearance 11 is disposed between the neighboring cooling units 4. The clearance 11 is disposed between one cooling tube 3 and the other cooling tube 3. Specifically, the clearance 11 is disposed between one side of the one cooling tube 3, which is opposite to the electric part 2, and another one side of the other cooling tube 3, which is opposite to the other electric part 2. The thickness D, i.e., the width of the clearance 11 is smaller than the thickness T of the electric part 2. For example, the thickness D of the clearance 11 is about 2 mm. The cooling tube 3 is made of aluminum, and formed by an extrusion method.

The electric part 2 is, for example, a semiconductor module including an IGBT (i.e., insulated gate bipolar transistor) and a diode. The electric part 2 is suitably used for an inverter of an automotive vehicle, an inverter for driving a motor in industrial equipment, an inverter for an air-conditioner in a building or the like. Further, the electric part can include a power transistor, a power FET (i.e., field effect transistor), IGBT or the like. The coolant 6 is, for example, water including anti-freezing liquid made of ethylene glycol system. Further, the coolant can be natural coolant such as water and ammonia, fluoro carbon series coolant such as fluorinert, chlorofluorocarbon system coolant such as HCFC123, HFC134a and the like, alcohol series coolant such as methanol, alcohol and the like, and ketone series coolant such as acetone.

The cooler 1 further includes a supply head 12 and a discharge head 13. The supply head 12 supplies the coolant 6 to the cooling tube 3. The discharge head 13 discharges the coolant 6 from the cooling tube 3. Both ends of each cooling tube 3 are connected to the supply head 12 and the discharge head 13, respectively. The connection between the cooling tube 3 and the supply head 12 or the discharge head 13 is performed by adhesion of adhesive made of resin system and/or a clinching method.

A method for manufacturing the cooler 1 is described as follows. Multiple cooling tubes 3 are aligned in parallel such that a predetermined distance is formed between the cooling tubes 3. The predetermined distance is determined by the thickness T of the electric part 2 and the thickness D of the clearance 11. The cooling tubes 3 are aligned to have the predetermined distance corresponding to the thickness T and the thickness D, which are alternately disposed between the cooling tubes 3. A pair of the cooling tubes 3, which is aligned in parallel such that the cooling tubes 3 include the thickness T of the electric part 2 therebetween, provides the cooling unit 4. Two electric parts are inserted in parallel between a pair of the cooling tubes 3 in the cooling unit 4.

After the electric parts are inserted, a pair of the cooling tubes 3 is fixed to pressurize the electric parts 2.

At this time, both ends of the cooling tubes 3 are connected to the supply head 12 and the discharge head 13, respectively. The cooling tube 3 is connected to the supply head 12 and the discharge head 13 by adhesion of adhesive made of resin system and/or a clinching method. Thus, the cooler 1 is completed.

Next, the cooler 1 according to the first embodiment works as follows. The clearance 11 is disposed between the neighboring two cooling units 4. Therefore, even when a heat generated in one electric part 2 is different from another heat generated in another electric part 2, the heat is prevented from transferring from the one electric part 2 to the other electric part 2. Thus, the cooling performance of the cooler 1 is improved.

Even when the heat generated in each electric part 2 varies so that thermal expansion generated from the heat also varies, each cooling unit 4 absorbs the heat so that the heat is prevented from transferring to the neighboring cooling unit 4. Thus, the heat generated in one electric part 2 does not affect another electric part 2. In other words, when the alternation of thickness T of the electric parts 2 differs, the cooling tube 3 having the flat shape in each cooling unit 4 deforms, i.e., bends in accordance with each electric part 2 so that the electric part 2 having different thickness T falls into space. Here, even when the cooling tube 3 deforms, the deformation does not affect another cooling unit 4. Specifically, the deformed cooling tube 3 does not contact another cooling unit 4.

Further, even when the thickness T of each electric part 2 is different, the difference of the thickness T can be absorbed in the cooling unit 4. Furthermore, even when the thicknesses T of two electric parts 2, which are disposed between the same pair of cooling unit 4, are different, the difference of the thicknesses T can be absorbed in the cooling unit 4. Therefore, the heat resistance of contact between the cooling tube 3 and the electric part 2 becomes smaller so that the cooling performance of the cooler 1 is improved.

The cooler 1 includes no pinching member for pinching the cooling unit 4 on both sides thereof. Therefore, the clearance 11 between the cooling units 4 can be narrowed so that the dimensions of the cooler 1 are minimized. The thickness D of the clearance 11 is smaller than the thickness T of the electric part 2. Therefore, the dimensions of the cooler 1 can become smaller. Further, since a distance between the neighboring electric parts 2 becomes shorter, electric resistance between the neighboring electric parts 2 becomes smaller in a case where terminals of the neighboring electric parts 2 are connected together. Furthermore, since thickness D of the clearance 11 is smaller than the thickness T of the electric part 2, the electric part 2 is prevented from inserting into the clearance 11 when the electric part 2 is assembled in the cooler 1. Thus, the electric part 2 is precisely inserted in a predetermined position, i.e., between a predetermined pair of the cooling tubes 3 in the cooling unit 4. Further, since the thickness D of the clearance 11 is about 2 mm, the cooler 1 has sufficient cooling performance and minimum dimensions.

Preferably, the thickness D of the clearance 11 is in a range between 0.1 mm and 10 mm. In this case, the cooler 1 has high cooling performance and minimum dimensions. If the thickness D of the clearance 11 is smaller than 0.1 mm, the heat generated in one electric part 2 may transfer to another electric part 2. Further, when the thickness of the electric part 2 becomes thicker, the neighboring cooling units 4 may contact each other so that the cooling performance is reduced. Therefore, it is preferred that the thickness D of the clearance 11 is equal to or larger than 0.1 mm. On the other hand, if the thickness D of the clearance 11 is larger than 10 mm, the dimensions of the cooler 1 become larger.

Second Embodiment

Figure 2:
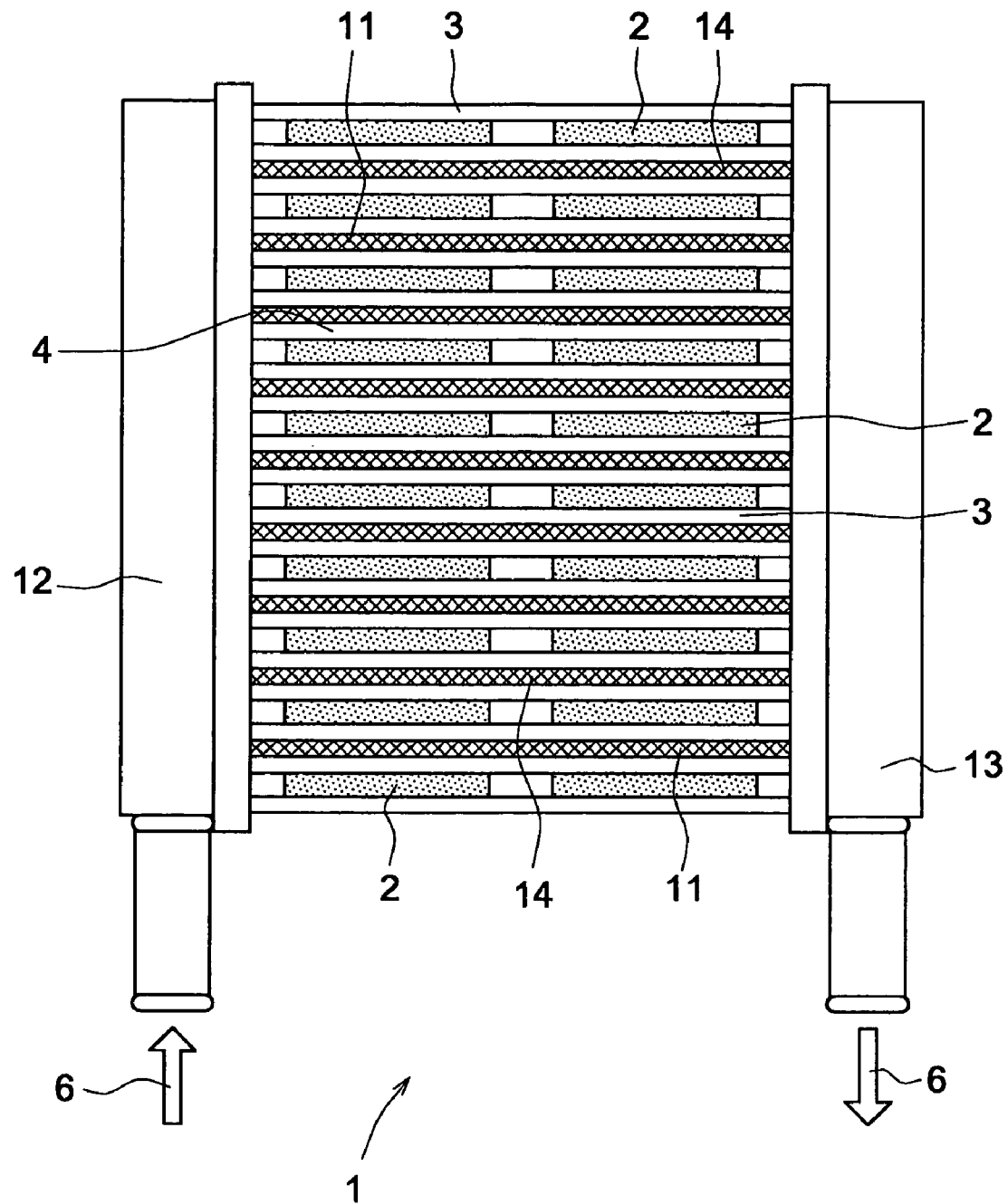
FIG. 2 is a plan view showing a cooler according to a second embodiment of the present invention.

A cooler 1 according to a second embodiment of the present invention is shown in FIG. 2. The cooler 1 includes a heat insulation member 14 inserted into the clearance 11. The heat insulation member 14 is made of resin having low heat conductivity and elasticity such as silicone plate, fluorine resin plate, resin filler, or rubber plate.

In this case, the heat generated in one electric part 2 is prevented from transferring to another electric part 2. Therefore, the cooler 1 has high cooling performance. Since the heat insulation member 14 has the elasticity, the different thickness T of the electric part 2 can be absorbed into each cooling unit 4, i.e., the heat insulation member 14. Thus, the electric part 2 is precisely sandwiched and fixed by the cooling tube 3. Accordingly, the cooling performance of the cooler 1 is improved.

Third Embodiment

Figure 3:
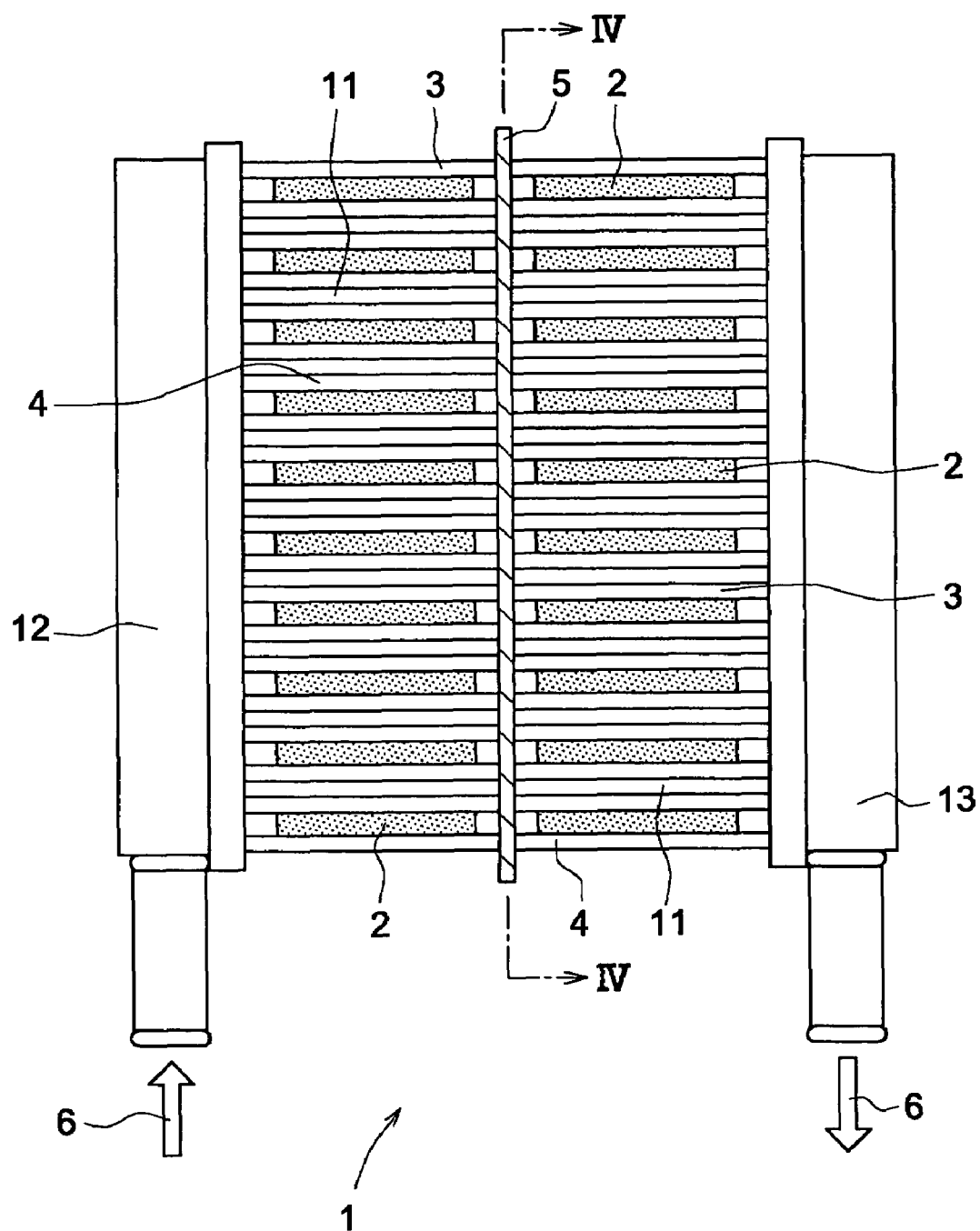
FIG. 3 is a plan view showing a cooler according to a third embodiment of the present invention.
Figure 4:
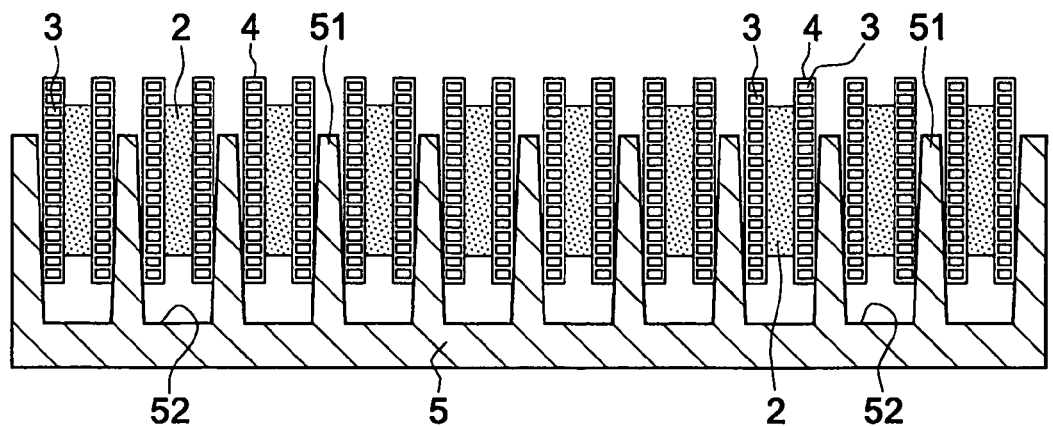
FIG. 4 is a cross sectional view showing the cooler taken along line IV-IV in FIG. 3.

A cooler 1 according to a third embodiment of the present invention is shown in FIGS. 3 and 4. The cooler 1 includes a stopper 5. The stopper 5 includes multiple convexities 51 and concavities 52. The convexity 51 has almost the same width as the thickness D of the clearance 11. The concavity 52 has almost the same width as the thickness of the cooling unit 4. The stopper 5 is inserted in the cooling unit 4 such that the convexity 51 is inserted into the clearance 11 and the cooling unit 4 is inserted into the concavity 52.

As shown in FIG. 3, the stopper 5 is disposed at a center position of the cooling tube 3 in a longitudinal direction. Specifically, the stopper 5 is disposed between two electric parts 2 disposed in parallel, and is perpendicular to the cooling tube 3. The concavity 52 of the stopper 5 is formed to have a tapered shape, which includes inner walls slightly slanted. After all of the electric parts 2 are inserted into the cooler 1, the stopper 5 is inserted into the cooler 1 such that the convexity 51 is press-inserted into the clearance 11.

In this case, the stopper 5 provides compression force between the electric part 2 and the cooling tube 3 so that the electric part 2 securely press-contacts and adheres to the cooling tube 3. Thus, the heat resistance of contact between the electric part 2 and the cooling tube 3 is reduced, so that the cooling performance of the cooler 1 is improved.

Further, the stopper 5 can be attached to multiple cooling units 3. Therefore, the manufacturing process of the cooler 1 is simplified, and the manufacturing cost of the cooler 1 is reduced.

Although the stopper 5 is composed of one part, the stopper 5 can be formed by multiple parts. For example, the stopper 5 includes upper and lower stoppers, which are inserted into the cooler 1 on both sides thereof. Although the stopper 5 is disposed at the center of the cooling tube 3, the stopper 5 can be disposed to cross a position of the electric part 2.

Fourth Embodiment

Figure 5:
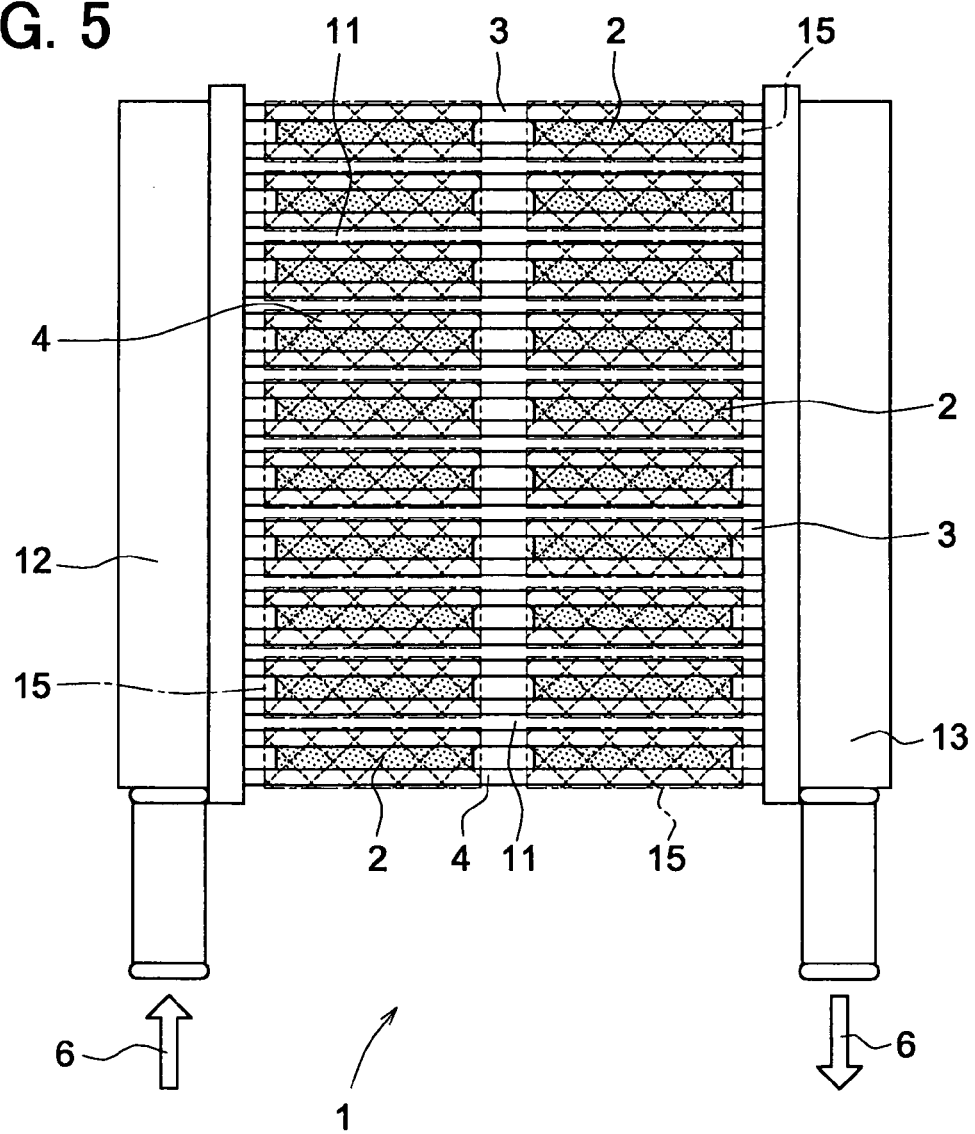
FIG. 5 is a plan view showing a cooler according to a fourth embodiment of the present invention.

A cooler 1 according to a fourth embodiment of the present invention is shown in FIG. 5. The cooler 1 includes adhesive 15 disposed between the electric part 2 and the cooling tube 3. The electric part 2 and a pair of the cooling tubes 3 are integrated by the adhesive 15. The adhesive 15 is made of thermo-conductive adhesive. In FIG. 5, the adhesive 15 protrudes on the upper surface of the electric part 2 and the cooling tube 3. In this case, the cooling tube 3 precisely and easily sandwiches the electric part 2. Further, the cooler 1 can have a thin pinching member for pinching the cooling unit 4 with the adhesive thereon.

Fifth Embodiment

A cooler 100 according to a fifth embodiment of the present invention is shown in FIGS. 6 to 10. The cooler 100 includes a semiconductor module 110 as an electric part and a cooling tube 120. The semiconductor module 110 includes a semiconductor chip such as a power device. The cooling tube 120 having a flat shape includes a hollow portion 121 for flowing the coolant therethrough. The cooler 100 includes a basic unit 102 as a cooling unit. The basic unit 102 has a pair of cooling tubes 120 facing each other, and the semiconductor module 110 disposed between a pair of cooling tubes 120. The cooling tubes 120 and the semiconductor module 110 are integrally molded with a resin mold 200.

Figure 9:
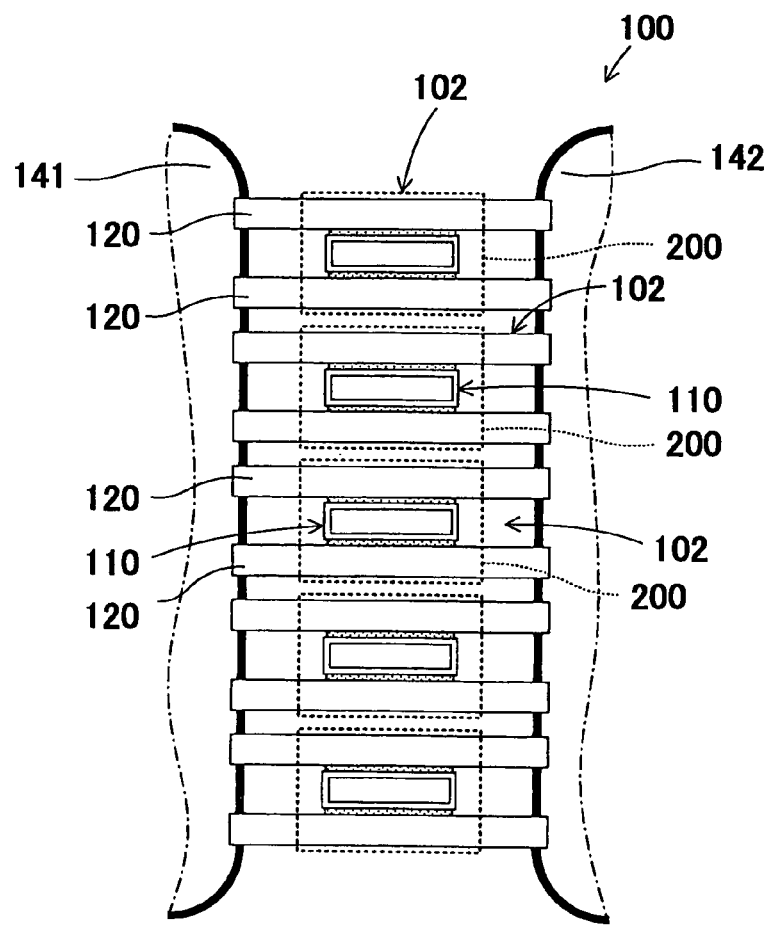
FIG. 9 is a plan view showing the cooler according to the fifth embodiment.

The cooler 100 is a part of power converter (not shown) of an electric vehicle, for example, as shown in FIG. 9. The power converter generates a driving current for energizing the driving motor of the vehicle. The cooler 100 includes multiple basic units 102 disposed in parallel. A pair of heads 141, 142 as supply and discharge heads is connected to the basic units 2, respectively.

Figure 6:
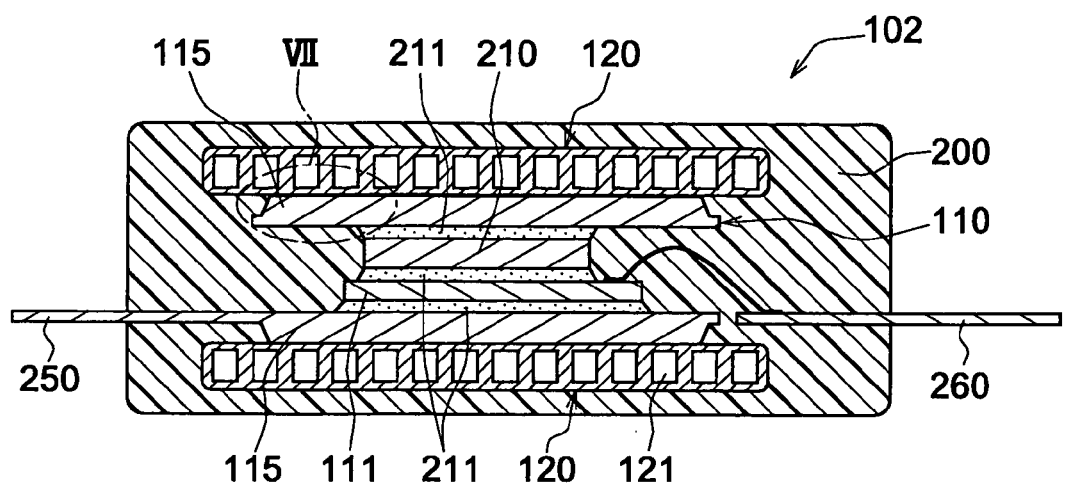
FIG. 6 is a cross sectional view showing a basic unit of a cooler according to a fifth embodiment of the present invention.
Figure 8:
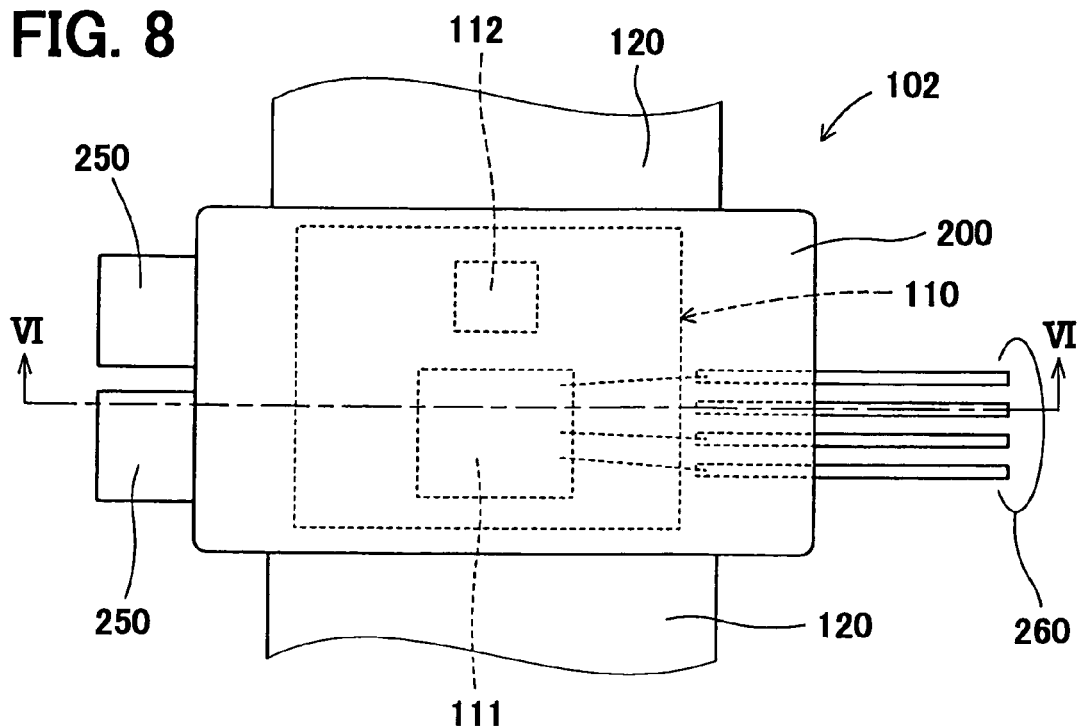
FIG. 8 is a plan view showing the basic unit of the cooler according to the fifth embodiment.

As shown in FIGS. 6 and 8, the basic unit 102 accommodates a semiconductor chip 111 as a power device. A pair of electrode plates 115 sandwiches the semiconductor chip 111 so that the semiconductor module 110 is formed. A pair of the cooling tubes 120 sandwiches the semiconductor module 110. The semiconductor module 110 includes an inverter circuit for electric power conversion equipment and/or a DC-DC converter circuit.

Figure 7:
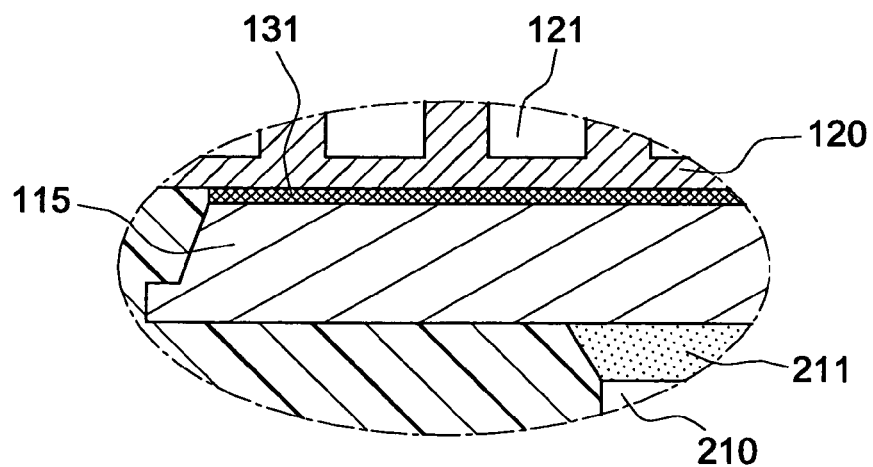
FIG. 7 is a partially enlarged cross sectional view showing a part VII of the cooler in FIG. 6.

FIG. 7 is a partially enlarged view showing the basic unit 102 in FIG. 6. The electrode plate 115 of the semiconductor module 110 and the cooling tube 120 are bonded together with an adhesive 131 made of thermo-conductive adhesive. Therefore, the electrode plate 115 is adhered to the cooling tube 120 with the adhesive 131 so that the heat exchange efficiency between the electrode plate 115 and the cooling tube 120 is improved. The semiconductor module 110 and a pair of the cooling tubes 120 are integrally molded with the resin mold 200. The electrode plate 115 can be bonded to the cooling tube 120 with grease having thermo conductivity. Then, the module 110 and the cooling tubes 120 are integrally molded with the resin mold 200.

The semiconductor module 110 includes the semiconductor chip 111 such as an IGBT device and a diode 112 such as a flywheel diode for smoothing a rotation of a motor. The semiconductor module 110 is sandwiched by a pair of the electrode plates 115, which faces each other. Thus, the chip 111, the diode 112 and a thermal buffer plate 210 are disposed between a pair of the electrode plates 115. Each of the chip 111, the diode 112 and the thermal buffer plate 210 are bonded with a solder layer 211 so that they are separated each other through the solder layer 211.

The module 110 further includes a power signal terminal 250 and a control terminal 260. The power signal terminal 250 is integrated with the electrode plate 115, and works as a terminal for electric power signal. The control terminal 260 works as a terminal for a control signal, and is molded in the resin mold 200. The power signal terminal 250 faces the control terminal 260 in a plane parallel to the electrode plate 115. The power signal terminal 250 protrudes from one side of the basic unit 102, and the control terminal 260 protrudes from the other side of the basic unit 102.

The cooling tube 120 is formed of a pipe having a flat shape. Specifically, the cooling tube 120 includes multiple hollow portions 121 for flowing the coolant, the hollow portions which are disposed in parallel. The cooling tube 120 is made of aluminum alloy, which includes aluminum having an including ratio of 97%.

The cooler 100 includes the heads 141, 142 made of nylon resin. The heads 141, 142 have a tank shape for supplying and discharging the coolant, respectively. Multiple basic units 102 are connected in parallel to the heads 141, 142. Thus, the hollow portion 121 of a pair of the cooling tube 120 in each basic unit 102 connects to the heads 141, 142, respectively. Since the heads 141, 142 are made of nylon resin having electrical insulation, each cooling tube 120 is electrically insulated each other, so that the module 110 is protected from electric short.

In the cooler 1, the coolant has electric insulation. Therefore, a pair of the electrode plates 115 of the module 110 is protected from electric short. Further, an insulation coat can be applied on the inner wall of the hollow portion 121 of the cooling tube 120. In this case, the coolant having conductivity can flow through the cooling tube 120.

Although the heads 141, 142 are made of nylon resin, the heads 141, 142 can be made of conductive material such as aluminum alloy, and an insulation member can be formed between the heads 141, 142 and the cooling tube 120. In this case, the heads 141, 142 are insulated from the cooling tube 120.

Thus, it is preferred that the cooling tube 120 is electrically insulated from the coolant, and a pair of the cooling tubes 120 is electrically insulated from another pair of the cooling tubes 120. In this case, each electrode plate 115 is protected from electric short therebeteen, and the thermal conductivity between the cooling tube 120 and the electrode plate 115 is improved. A method for insulating the cooling tube 120 from the coolant is such that the coolant is made of liquid having electrical insulation property, or the inner wall of the cooling tube 120 is coated with an insulation film. A method for insulating the cooling tube 120 from the heads 141, 142 is such that an insulation material is inserted between the cooling tube 120 and the heads 141, 142, or the heads 141, 142 are made of electrical insulation material. It is preferred that the cooling tube 120 is insulated from the electrode plate 115 in such a manner that an insulation member is inserted between the cooling tube 120 and the electrode plate 115. In this case, a pair of the cooling tubes 120 is electrically insulated from another pair of the cooling tubes 120.

Figure 10:
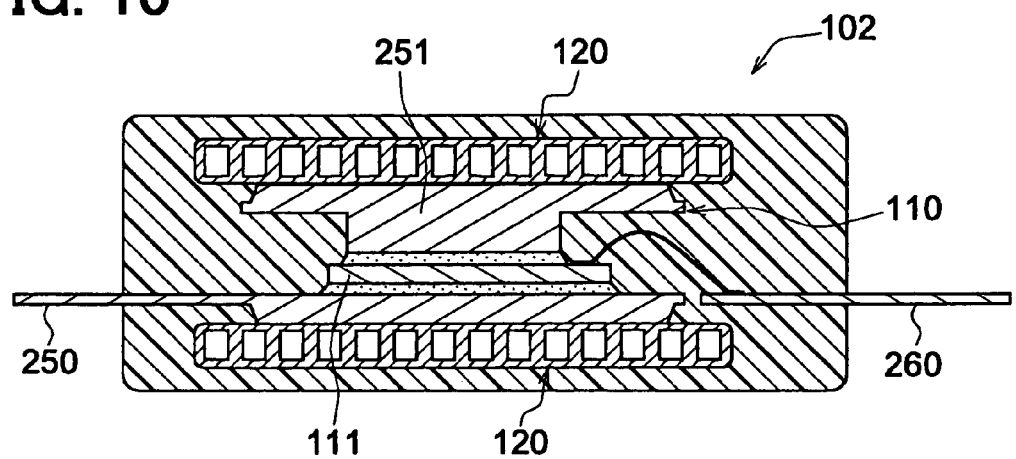
FIG. 10 is a cross sectional view showing another basic unit of the cooler according to a modification of the fifth embodiment.

Although multiple basic units 102 provide the cooler 100, one basic unit 102 can be connected to a pair of the heads 141, 142. Furthermore, as shown in FIG. 10, the thermal buffer plate 210 and the electrode plate 115 can be integrated so that an integrated electrode plate 251 is formed.

In the cooler 100, the module 110 with the cooling tube 120 is integrally molded with the resin mold 200. Therefore, the module 110 effectively and stably contacts the cooling tube 120 without applying any load between the cooling tube 120 and the module 110. Further, no load is applied between the cooling tube 120 and the module 110, so that the module 110 with the cooling tube 120 is not deformed substantially in a stacking direction by the load. Thus, the cooler 100 has high accuracy of form.

Sixth Embodiment

Figure 11:
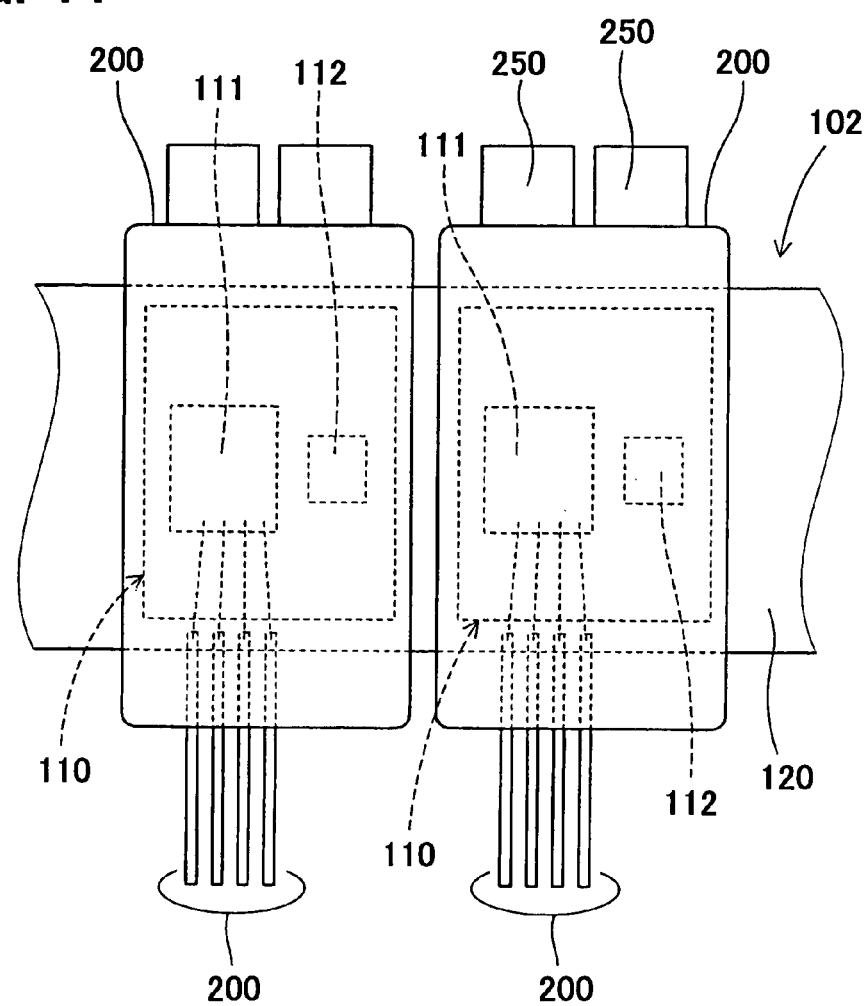
FIG. 11 is a plan view showing a basic unit of a cooler according to a sixth embodiment of the present invention.
Figure 12:
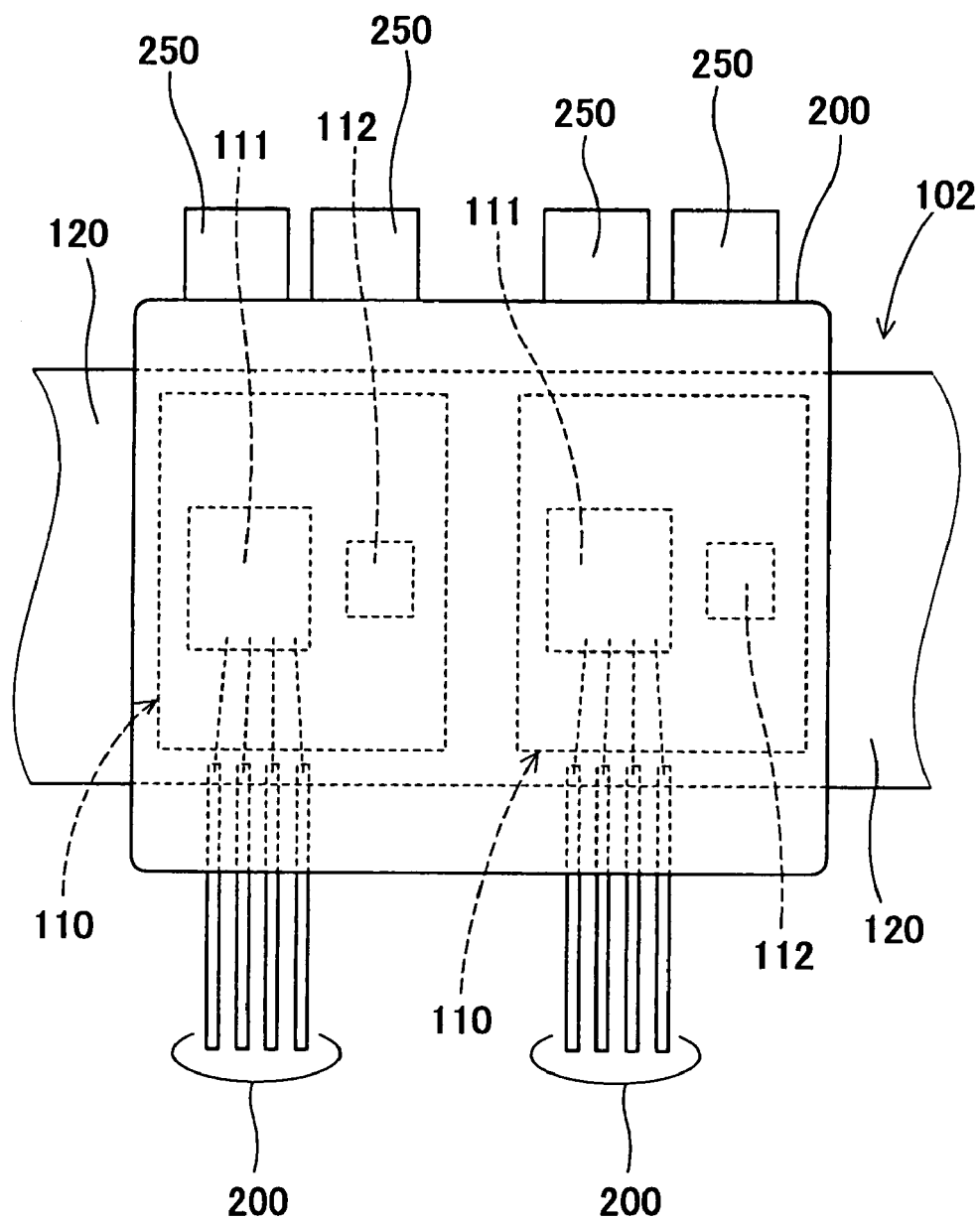
FIG. 12 is a plan view showing another basic unit of the cooler according to a modification of the sixth embodiment.

A cooler 100 according to a sixth embodiment of the present invention is shown in FIGS. 11 and 12. The cooler 100 includes the basic unit 102 with a pair of the cooling tubes 120. Two modules 110 are disposed in parallel between the cooling tubes 120. In the basic unit 102, each module 110 is independently molded with the resin mold 200, as shown in FIG. 11. Further, as shown in FIG. 12, in the basic unit 102, two modules 110 disposed between a pair of the cooling tubes 120 can be integrally molded with resin mold 200.

Seventh Embodiment

Figure 13:
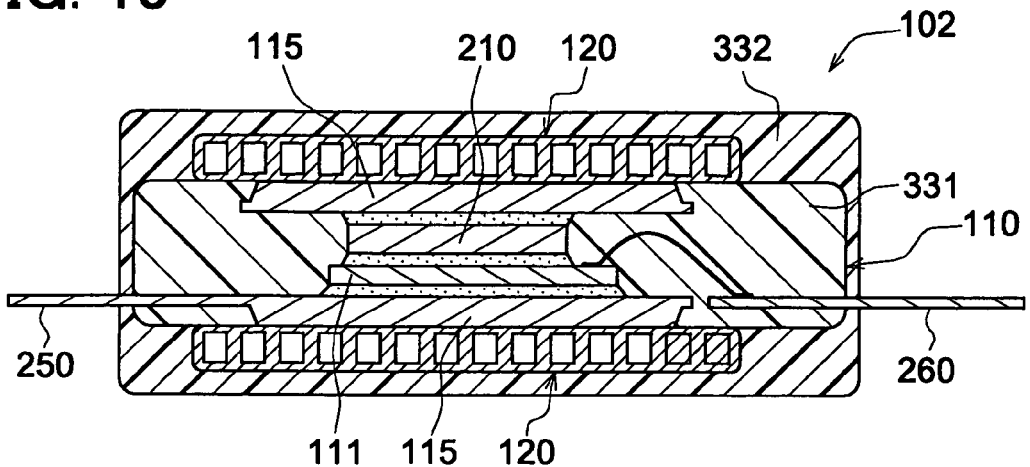
FIG. 13 is a cross sectional view showing a basic unit of a cooler according to a seventh embodiment of the present invention.

A cooler 100 according to a seventh embodiment of the present invention is shown in FIG. 13. The basic unit 102 includes the first and second resin molds 331, 332, which mold the module 110 doubly. Specifically, the module 110 having a pair of the electrode plates 115 and the chip 111 is integrally molded with the first resin mold 331. Here, a top of each electrode plate 115 is exposed from the first resin mold 331. The module 110 is sandwiched with a pair of the cooling tubes 120. The second resin mold 332 integrally molds the module 110 with a pair of the cooling tubes 120.

The first and second resin molds 331, 332 are made of thermosetting resin. In this embodiment, the first resin mold 331 is made of epoxy resin or the like. The second resin mold 332 is made of PPS (i.e., polyphenylene sulfide) or the like. The second resin mold 332 can be made of epoxy resin. Further, the first and second resin molds 331, 332 can be made of epoxy resin and epoxy resin, epoxy resin and PPS, PBT (i.e., polybutylene terephthalate) and PPS, or the like, respectively. The first resin mold 331 does not become hardened at a curing temperature of the second resin mold 332. Therefore, when the module 110 and a pair of the cooling tubes 120 are molded with the second resin mold 332, the first resin mold 331 molding the module 110 does not become softened.

Since the module 110 is molded with the first resin mold 331 so that the semiconductor chip 111, i.e., the IGBT device and the cooling tube 120 are integrated, the module 110 is easily handled. Specifically, after the module 110 is integrally molded with the first resin mold 331, a pair of the cooling tubes 120 is mounted on both sides of the module 110. Then, the module 110 with the cooling tubes 120 is integrally molded with the second resin mold 332. Thus, the working efficiency for manufacturing the cooler 100 is improved so that the basic unit 102 is precisely formed.

Eighth Embodiment

Figure 14:
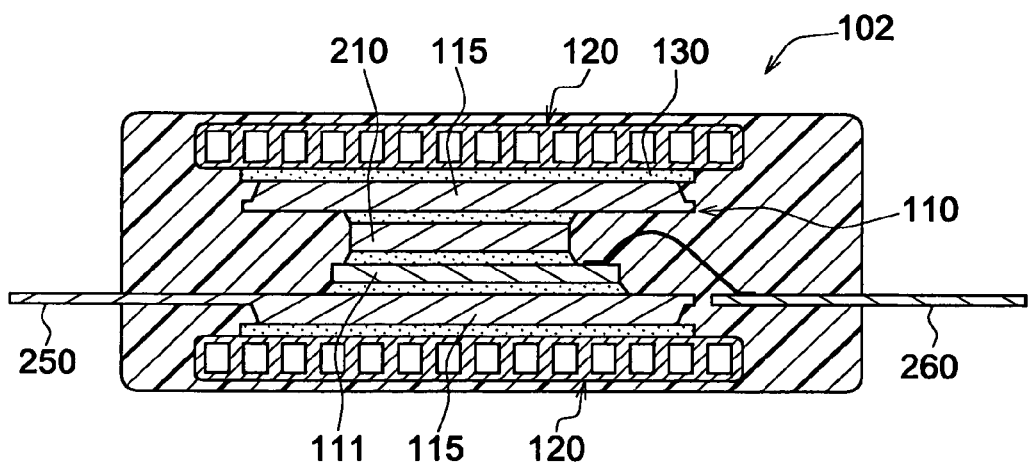
FIG. 14 is a cross sectional view showing a basic unit of a cooler according to an eighth embodiment of the present invention.
Figure 15:
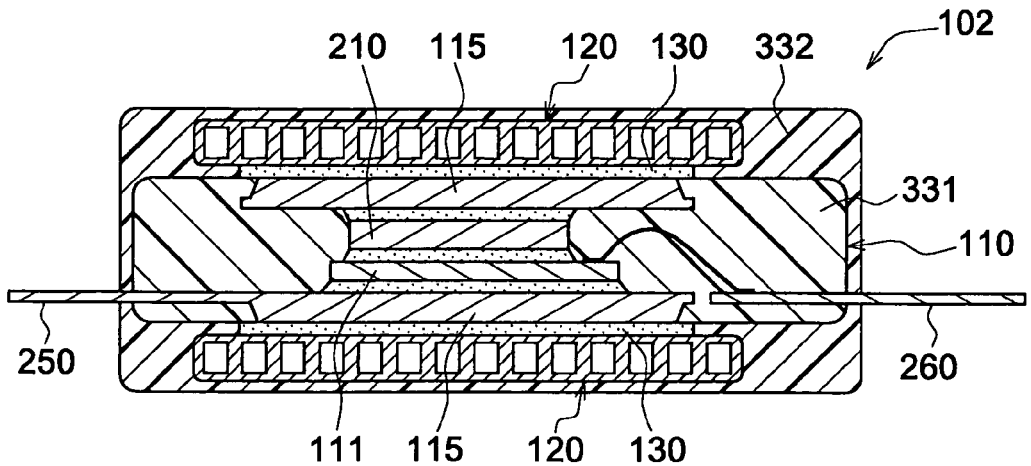
FIG. 15 is a cross sectional view showing another basic unit of the cooler according to a modification of the eighth embodiment.

A cooler 100 according to an eighth embodiment of the present invention is shown in FIGS. 14 and 15. The basic unit 102 includes a ceramic plate 130 as an insulation plate. The ceramic plate 130 is made of aluminum oxide, and has a thickness in a range between 200 μm and 300 μm. The ceramic plate 130 has electrical insulation property. The ceramic plate 130 is disposed between the electrode plate 115 of the module 110 and the cooling tube 120. The ceramic plate 130 can be made of another ceramic plate such as SiN (i.e., silicon nitride) or alumina. Further, the ceramic plate 130 can be made of another insulation member. In this case, the insulation member can be formed with an insulation coating film such as a ceramic insulation film or an organic insulation film. The ceramic insulation film is, for example, an aluminum oxide film, a SiN film, or an alumina film. The organic insulation film is, for example, a DLC (i.e., diamond like carbon) film, or a poly-imide film.

In this case, the cooling tubes 120 are insulated each other. Therefore, no additional part for insulating a pair of the cooling tubes 120 is required.

The basic unit 102 can include the first and second resin molds 331, 332, which mold the module 110 doubly, as shown in FIG. 15. In this case, the semiconductor chip 111 and a pair of the electrode plates 115 are integrally molded with the first resin mold 331. Then, the ceramic plate 130 is inserted between the module 110 and the cooling tube 120. After that, the module 110 with the cooling tube 120 and the ceramic plate 130 is molded with the second resin mold 332.

Ninth Embodiment

Figure 16:
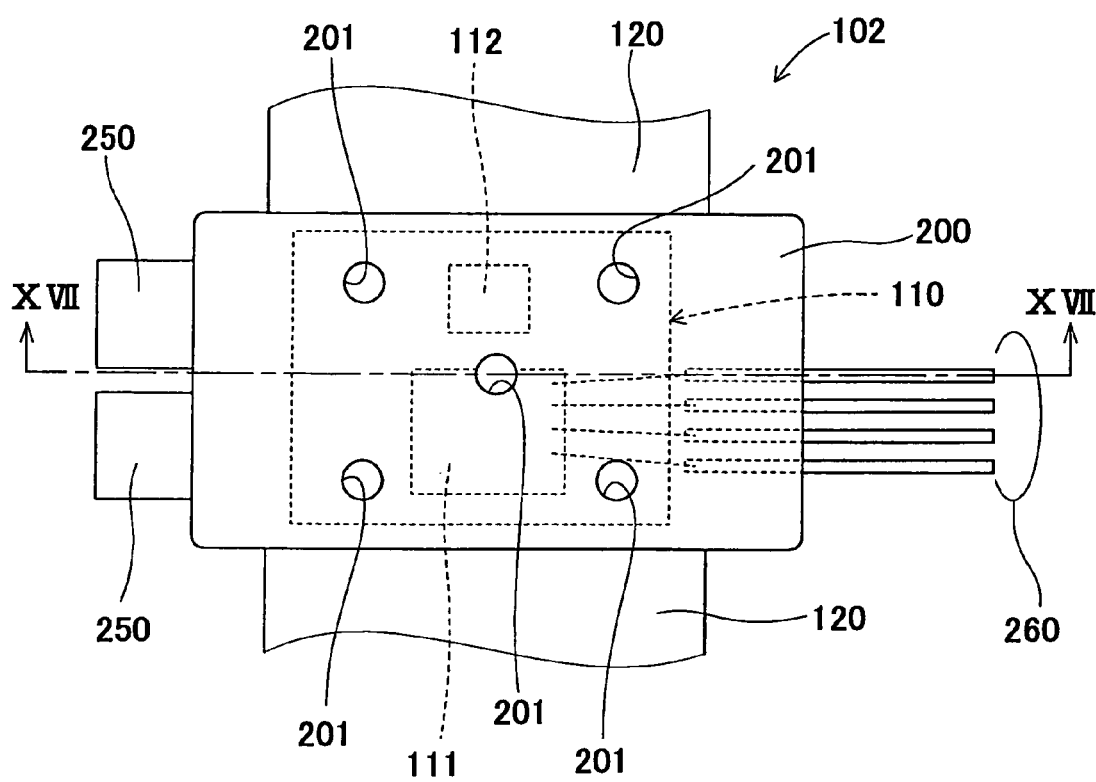
FIG. 16 is a plan view showing a basic unit of a cooler according to a ninth embodiment of the present invention.
Figure 17:
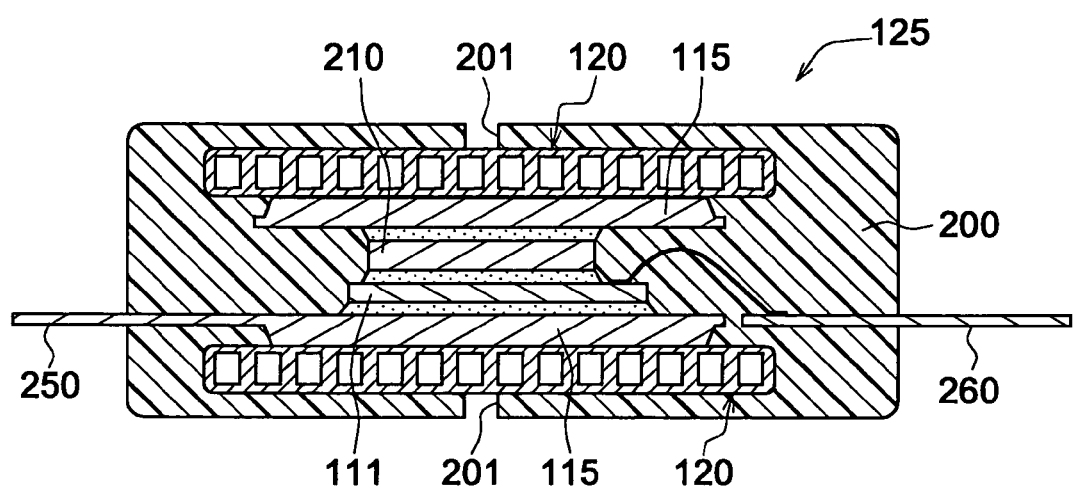
FIG. 17 is a cross sectional view showing the basic unit taken along line XVII-XVII in FIG. 16.
Figure 18:
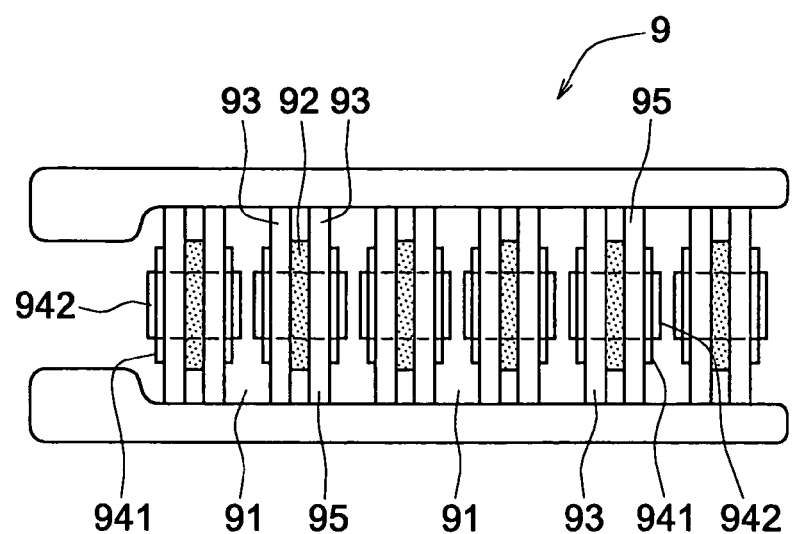
FIG. 18 is a plan view showing a cooler according to a prior art.

A cooler 100 according to a ninth embodiment of the present invention is shown in FIGS. 16 and 17. The basic unit 102 includes multiple concavities 201. The concavity 201 is disposed from the outer surface of the resin mold 200 to the surface of the cooling tube 120.

The concavity 201 improves the cooling performance of the cooler 100. Thus, the module 110 is effectively cooled by the cooling tube 120. This is because the heat generated in the module 110 is transferred to the cooling tube 120, and then, the heat is discharged from the surface of the cooling tube 120 to the outside through the concavity 201.

When the basic unit 102 is molded with the resin mold 200, the module 110 and the cooling tube 120, which are preliminary assembled, are held with a jig (not shown). The jig has a support member corresponding to the concavity 201. Therefore, after the module 110 with the cooling tube 120 is molded with the resin mold 200, the concavity 201 is formed by the support member of the jig. Thus, the basic unit 102, i.e., the concavity 201 is easily formed by using the jig. Further, the basic unit 102 is formed precisely so that the basic unit 102 has high accuracy of form.

Such changes and modifications are to be understood as being within the scope of the present invention as defined by the appended claims.

What is claimed is:

1. A cooler for cooling a plurality of electric parts from both sides thereof, the cooler comprising:
    a plurality of cooling units each including a pair of cooling tubes for flowing coolant therethrough;
    wherein the pair of cooling tubes is disposed to sandwich an electric part so that both sides of the electric part are cooled by the pair of cooling tubes, the cooling tubes having a flat shape;
    wherein the cooling units are disposed to align in a stacking direction; and
    wherein a clearance is disposed between neighboring cooling units in the stacking direction and a heat insulation member is disposed in the clearance between the cooling units.

2. The cooler according to claim 1,
    wherein the clearance has a width in the stacking direction of the cooling units, and
    wherein the width of the clearance is smaller than a thickness of the electric part in the stacking direction.

3. The cooler according to claim 1,
    wherein the width of the clearance is in a range between 0.1 mm and 10 mm.

4. The cooler according to claim 1,
    wherein the pair of cooling tubes sandwiches two electric parts, which are disposed in parallel with the cooling tubes.

5. The cooler according to claim 1, further comprising:
a pair of heads disposed on both ends of the cooling units so that each head is connected to each pair of cooling tubes, and
wherein one head supplies the coolant to the cooling tubes, and the other head discharges the coolant from the cooling tubes.

6. The cooler according to claim 5,
wherein the pair of heads has a longitudinal direction, which is parallel to the stacking direction of the cooling units, and perpendicular to a longitudinal direction of the cooling tubes.

7. The cooler according to claim 6,
wherein the cooling tubes are made of aluminum.

8. A cooler for cooling a plurality of electric parts from both sides thereof, the cooler comprising:
a plurality of cooling units each including a pair of cooling tubes for flowing coolant therethrough,
wherein the pair of cooling tubes is disposed to sandwich an electric part so that both sides of the electric part are cooled by the pair of cooling tubes, the cooling tubes having a flat shape;
wherein the cooling units are disposed to align in a stacking direction;
wherein a clearance is disposed between neighboring cooling units in the stacking direction;
a stopper having a plurality of convexities and concavities;
wherein the convexity has a thickness almost equal to a width of the clearance in the stacking direction;
wherein the concavity has a width almost equal to a thickness of the cooling unit in the stacking direction, and disposed between two convexities; and
wherein the convexity is disposed in the clearance, and the cooling unit is disposed in the concavity.

9. A cooler for cooling a plurality of electric parts from both sides thereof, the cooler comprising:
a plurality of cooling units each including a pair of cooling tubes for flowing coolant therethrough;
wherein the pair of cooling tubes is disposed to sandwich an electric part so that both sides of the electric part are cooled by the pair of cooling tubes, the cooling tubes having a flat shape;
wherein the cooling units are disposed to align in a stacking direction;
wherein a clearance is disposed between neighboring cooling units in the stacking direction; and
an adhesive disposed between a cooling tube and the electric part so that the pair of cooling tubes and the electric part are integrated.

10. A cooler for cooling an electric part from both sides thereof, the cooler comprising:
a cooling unit including a pair of cooling tubes for flowing coolant therethrough and a semiconductor module having the electric part,
wherein each cooling tube has a flat shape, and includes a hollow portion for passing the coolant therethrough,
wherein the pair of cooling tubes faces each other,
wherein the semiconductor module is disposed between the pair of cooling tubes, and
wherein the semiconductor module with the pair of cooling tubes is molded with a resin mold;
wherein the semiconductor module includes a pair of electrode plates facing each other to sandwich the electric part,
wherein the resin mold includes a first resin mold and a second resin mold,
wherein the semiconductor module is molded with the first resin mold, and
wherein the semiconductor module molded with the first resin mold and the pair of cooling tubes are molded with the second resin mold.

11. The cooler according to claim 10,
wherein the first and second resin molds are made of thermosetting resin, and
wherein the first resin mold has a property such that the first resin mold does not become softened at a curing temperature of the second resin mold.

12. The cooler according to claim 10,
wherein the cooling tube electrically connects to the electrode plate, and
wherein the cooling tube is electrically insulated from the coolant, and one cooling tube is electrically insulated from the other cooling tube.

13. The cooler according to claim 10, further comprising:
a plurality of cooling units; and
a pair of heads,
wherein each head is connected to a plurality of cooling units in parallel, and
wherein the hollow portion of each cooling tube is connected to the heads so that the coolant flows through the heads and the cooling units.

14. The cooler according to claim 10, further comprising:
an insulation member disposed between the cooling tube and the electrode plate.

15. The cooler according to claim 10, further comprising:
a plurality of cooling units disposed to align in a stacking direction,
wherein a clearance is disposed between neighboring cooling units in the stacking direction.

16. The cooler according to claim 15, wherein;
the clearance has a width in the stacking direction of the cooling units, and
the width of the clearance is smaller than a thickness of the electric part in the stacking direction.

17. A cooler for cooling an electric part from both sides thereof, the cooler comprising:
a cooling unit including a pair of cooling tubes for flowing coolant therethrough and a semiconductor module having the electric part,
wherein each cooling tube has a flat shape, and includes a hollow portion for passing the coolant therethrough,
wherein the pair of cooling tubes faces each other,
wherein the semiconductor module is disposed between the pair of cooling tubes,
wherein the semiconductor module with the pair of cooling tubes is molded with a resin mold;
a concavity; and
wherein the concavity has a bottom disposed at a surface of the cooling tube and an opening for opening to an outside from the resin mold.

* * * * *